US006271069B1

(12) United States Patent
Chen et al.

(10) Patent No.: US 6,271,069 B1
(45) Date of Patent: Aug. 7, 2001

(54) METHOD OF MAKING AN ARTICLE COMPRISING AN OXIDE LAYER ON A GAAS-BASED SEMICONDUCTOR BODY

(75) Inventors: Young-Kai Chen, Berkeley Heights; Alfred Yi Cho; William Scott Hobson, both of Summit; Minghwei Hong, Watchung; Jenn-Ming Kuo, Edison; Jueinai Raynien Kwo, Watchung; Donald Winslow Murphy, Green Brook; Fan Ren, Warren, all of NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/122,558

(22) Filed: Jul. 24, 1998

Related U.S. Application Data

(63) Continuation-in-part of application No. 08/741,010, filed on Oct. 31, 1996, which is a continuation-in-part of application No. 08/408,678, filed on Mar. 22, 1995, now Pat. No. 5,821,171, which is a continuation-in-part of application No. 08/217,332, filed on Mar. 23, 1994, now Pat. No. 5,550,089.

(51) Int. Cl.[7] .................................................. H01L 29/76
(52) U.S. Cl. ........................ 438/204; 438/142; 438/197; 438/236; 438/767; 438/779; 257/410; 257/411
(58) Field of Search ..................................... 438/142, 157, 438/204, 236, 767, 779; 257/410, 411

(56) References Cited

U.S. PATENT DOCUMENTS 3,663,870    5/1972  Tsutsumi et al. ..................... 317/235

FOREIGN PATENT DOCUMENTS 0203578    12/1986  (EP) ............................ H01L/21/314
0863552A1   9/1998  (EP) ............................. H01L/29/51

OTHER PUBLICATIONS

Hong et al., *IEEE*, "Growth of $Ga_2O_3(Gd_2O_3)$ Using Molecular Beam Epitaxy Technique–Key to First Demonstration of GaAs MOSFET's", pp. 319–324, Sep. 1997.
Ren et al., *IEEE*, "III–V Compound Semiconductor MOSFETs Using $Ga_2O_3(Gd_2O_3)$ As Gate Dielectric", pp. 18–21, Oct. 1997.

Primary Examiner—Chandra Chaudhari
Assistant Examiner—Lisa Kilday
(74) Attorney, Agent, or Firm—Eugen E. Pacher

(57) ABSTRACT

Disclosed are a method of making GaAs-based enhancement-type MOS-FETs, and articles (e.g., GaAs-based ICs) that comprise such a MOS-FET. The MOS-FETs are planar devices, without etched recess or epitaxial re-growth, with gate oxide that is primarily $Ga_2O_3$, and with low midgap interface state density (e.g., at most $1 \times 10^{11}$ $cm^{-2} eV^{-1}$ at 20° C.). The method involves ion implantation, implant activation in an As-containing atmosphere, surface reconstruction, and in situ deposition of the gate oxide. In preferred embodiments, no processing step subsequent to gate oxide formation is carried out above 300° C. in air, or above about 700° C. in UHV. The method makes possible fabrication of planar enhancement-type MOS-FETs having excellent characteristics, and also makes possible fabrication of complementary MOS-FETs, as well as ICs comprising MOS-FETs and MES-FETs. The method includes deposition of gate oxide of overall composition $Ga_xA_yO_z$, where Ga substantially is in the 3+ oxidation state, A is one or more electropositive stabilizer element adapted for stabilizing Ga in the 3+ oxidation state, x is greater than or equal to zero, z is selected to satisfy the requirement that both Ga and A are substantially fully oxidized, and y/(x+y) is greater than 0.1.

17 Claims, 9 Drawing Sheets

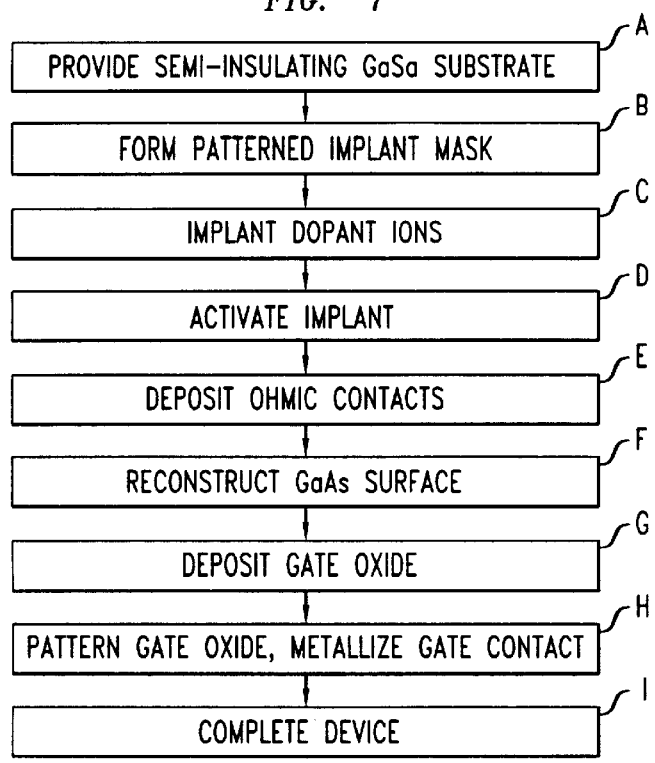
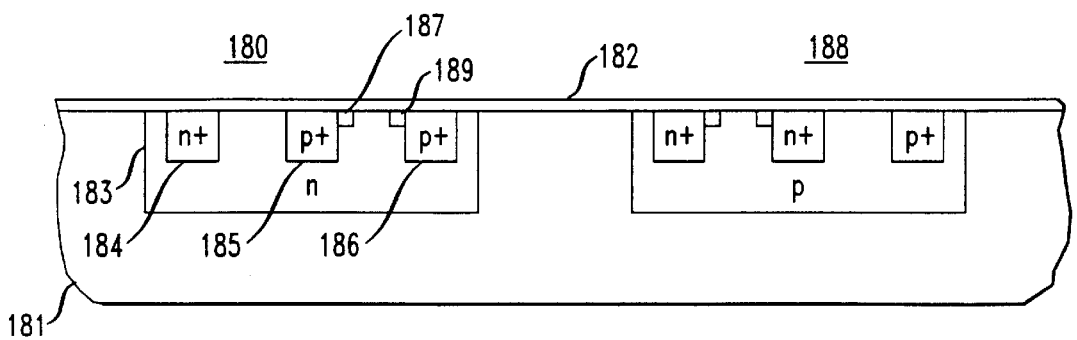
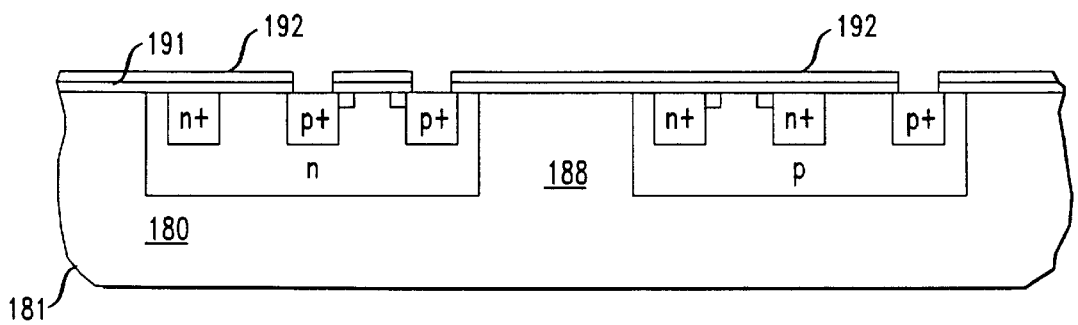

METHOD OF MAKING AN ARTICLE COMPRISING AN OXIDE LAYER ON A GAAS-BASED SEMICONDUCTOR BODY

CROSS REFERENCE TO RELATED APPLICATION

This application is a continuation-in-part of U.S. patent application Ser. No. 08/741,010, filed Oct. 31, 1996; which is a continuation in part of application Ser. No. 08/408,678, filed Mar. 22, 1995 now U.S. Pat. No. 5,821,171, which is a continuation-in part of U.S. patent application Ser. No. 08/217,332, filed Mar. 23, 1994, now U.S. Pat. No. 5,550,089.

This application is also related to application Ser. No. 09/093557, filed Jun. 8, 1998, by Hong et al., which is a continuation-in-part application of the above-referenced '010 application.

TECHNICAL FIELD

This invention pertains to methods of making articles that comprise an oxide layer on a GaAs-based semiconductor body, typically GaAs-based field effect transistors (FETs).

BACKGROUND OF THE INVENTION

GaAs-based transistors and circuits are used in, for instance, wireless communication apparatus, due inter alia to the relatively high electron mobility in GaAs, the availability of semi-insulating GaAs substrates, and the relative simplicity of the manufacturing processes.

Si-based metal oxide semiconductor (MOS) field effect transistors (FETs) are known, and are widely used. Among the advantages of Si-based MOS-FETs are simplicity, low power and low cost. The most common Si-based MOS-FET is the enhancement-type MOS-FET, which is "normally off" with zero gate voltage.

As is well known, an important factor in Si MOS-FET technology is the ease with which a high quality stable and controllable silicon oxide layer can be formed on the conventional (100) surface of a Si wafer. This includes a very low (e.g., $10^{10}$ cm$^{-2}$eV$^{-1}$ or less) surface state density at the Si/silicon oxide interface.

Much effort has been directed towards GaAs-based MOS-FETs. See, for instance, T. Mimura et al., *IEEE Transactions on Electron Devices*, Vol. ED-27(6), p. 1147 (June 1980) for a review of early work. The authors of that paper concluded (p. 1154) that, although the main features of the results achieved so far are promising, ". . . some technological problems remain, including anomalous behavior of the dc and low-frequency operation of the devices. Undoubtedly, these problems are associated with the high density of surface states involved in the GaAs MOS system." See also A. Colquhoun et al., *IEEE Transactions on Electron Devices*, Vol. ED 25(3), p. 375 (March 1978), and H. Takagi et al., *IEEE Transactions on Electron Devices*, Vol. ED 25 (5), p. 551 (May 1978). The former discloses a device that comprises an etched notch that defines the channel thickness. Such a non-planar structure would be relatively difficult to make repeatably, and thus is less desirable than a planar MOS-FET would be.

As pointed out by Mimura et al., the early devices suffered from poor gate oxide/GaAs interface quality, including a high density of interface states. In recent years, substantial effort has been directed at this problem.

For instance, U.S. Pat. No. 5,451,548 discloses formation of a $Ga_2O_3$ film on GaAs by e-beam evaporation from a high purity single crystal of $Gd_3Ga_5O_{12}$. See also U.S. Pat. No. 5,550,089, and U.S. patent application Ser. Nos. 08/408,678 and 08/741,010, which disclose GaAs/$Ga_2O_3$ structures with low midgap interface state density. See also M. Passlack et al., *Applied Physics Letters*, Vol. 69(3), p. 302 (July 1996) which reports on the thermodynamic and photochemical stability of low interface state density GaAs/$Ga_2O_3$/$SiO_2$ structures that were fabricated using in situ molecular beam epitaxy. Other pertinent publications are M. Passlack et al., *Applied Physics Letters*, Vol. 68(8), p. 1099 (Febuarary 1996); and M. Hong et al., *J. of Vacuum Science and Technology B*, Vol. 14(3), p. 2297, (May/June 1996).

However, despite the extensive effort by many researchers over many years, and the resulting large number of publications, to date it has not been possible, to the best of our knowledge, to fabricate GaAs-based MOS-FETs that can meet commercial requirements.

In the absence of a commercially viable GaAs-based MOS-FET technology, GaAs-based integrated circuits for instance require double supply voltages and have relatively high power consumption, resulting in turn in relatively short battery lifetime and requiring relatively complex circuitry in, for instance, battery-powered personal communication devices. Such ICs are of limited usefulness.

In view of the significant advantages that would attend availability of commercially acceptable GaAs-based MOS-FETs, it would be highly desirable to have available such devices, especially enhancement mode (normally "off") MOS-FETs. This application discloses an exemplary process of making such devices that provides low gate oxide/semiconductor interface state density, and can preserve this low state density throughout the subsequent processing steps.

SUMMARY OF THE INVENTION

A currently preferred exemplary embodiment of the invention is a method of making an article that comprises a GaAs-based (e.g., GaAs or a ternary or quaternary III–V alloy that comprises Ga and As) semiconductor body having a major surface, and that further comprises a layer of oxide dielectric material disposed on the major surface.

The method comprises providing the semiconductor body, and forming the layer of oxide dielectric material on the major surface, said forming comprising completion (at a time $t_m$) of a first monolayer of the oxide dielectric material on the major surface. The major surface is prepared (e.g., by MBE growth of a semiconductor layer on a substrate body, and/or by appropriate cleaning or cleaving in UHV) such that, at a given point ($t_c$) in time the major surface is substantially atomically clean and substantially atomically ordered. A (100)-oriented surface is considered to be "substantially atomically clean" if surface coverage by impurity atoms is less than (typically substantially less than) 1% of a monolayer, preferably less than 0.1% of a monolayer. The degree of coverage by impurity atoms can be measured by a known technique (XPS). See, for instance, P. Pianetta et al., *Phys. Rev. Letters*, Vol. 35 (20), p. 1356 (1975).

Furthermore, at least during the period from $t_c$ to $t_m$, the semiconductor body is maintained in a reduced pressure atmosphere (typically UHV), the conditions (time, pressure, temperature, etc.) selected such that, at time $t=t_m$, the coverage of the surface with impurity atoms is less than 1% of a monolayer. Exemplarily, this condition is typically met if the pressure p(t) is selected such that $$\int_{t_c}^{t_m} p(t)\,dt$$

is at most 100 Langmuir. A "Langmuir" is a conventional measure of surface exposure, namely $1\times10^{-6}$ Torr seconds. In preferred embodiments the value of the integral is less than 50, even less than 10 Langmuir. It will be appreciated that p(t) is the pressure due to impurity species such as $O_2$, CO, $H_2O$, and does not include the pressure due to growth species or surface stabilizers such as As.

At time $t=t_c$ the surface is not only substantially atomically clean but also substantially atomically ordered. By a "substantially atomically ordered" (100) GaAs surface we mean herein a (100) GaAs surface exhibiting a 2×4 (or possibly 4×6 or other) RHEED (reflection high energy electron diffraction) pattern. Methods that can be used to produce a substantially atomically ordered (100) GaAs surface are known.

GaAs-based semiconductor/oxide interfaces formed according to our technique not only can have very low density of interface states (exemplarily $<10^{11}/cm^2\cdot eV$) and low surface recombination velocity (exemplarily $<10^4 cm/s$), with inversion observed in both n-type and p-type material, but also have high thermochemical and photochemical stability. These values pertain to room temperature (20° C.). All of these advantageous properties are observed on (100)-oriented interfaces, and thus are directly applicable to electronic devices such as MOS-FETs.

The instant invention exemplarily is embodied in a method of making an article (e.g., an IC, or a personal communication device that comprises the IC) that comprises a GaAs-based MOS-FET having improved characteristics, including a low gate oxide/semiconductor midgap interface state density.

More specifically, the invention is embodied in a method of making an article that comprises a GaAs-based MOS-FET comprising a GaAs-based substrate having a major surface, two spaced apart regions of a first conductivity type extending from the major surface into the substrate (designated "source" and "drain", respectively), a metal contact disposed on each of said source and drain, with an oxide layer (designated "gate oxide") disposed on the major surface between the source and the drain, and with a gate metal contact disposed on the gate oxide layer.

Significantly, the MOS-FET is a planar device (i.e., the semiconductor surface is planar, without etched recesses or epitaxial regrowth), the source and drain regions extend into the GaAs-based material of a second conductivity type, associated with the gate oxide/semiconductor interface is a midgap interface state density of at most $10^{11}$ cm$^{-2}$eV$^{-1}$, and the MOS-FET exemplarily is an enhancement-mode MOS-FET adapted for forming a first conductivity type channel between source and drain upon application of a voltage to the gate metal contact.

The gate oxide layer has overall composition $Ga_xA_yO_z$, where Ga substantially is in a 3+ oxidation state, where A is one or more electropositive stabilizer element for stabilizing Ga in the 3+ oxidation state, x is greater than or equal to zero, y/(x+y) is greater than or equal to 0.1, and z is sufficient to satisfy the requirement that Ga and A are substantially fully oxidized. Herein, Ga and A each are considered to be "substantially fully oxidized" if at least 80% (preferably at least 90%) of the respective element is fully oxidized, i.e., is in the highest oxidation state of the element. The highest oxidation state of Ga is 3+. The highest oxidation state of A depends on A. For instance, if A is an alkaline earth, then the state is 2+, and if A is Sc, Y, or a rare earth element, then the state is frequently, but not always, 3+.

The method of making the article comprises the steps of providing the GaAs-based semiconductor body, treating the body such that at least a portion of a major surface of the body is essentially atomically clean and essentially atomically ordered, forming, substantially without exposure of the semiconductor body to contamination, the oxide layer on the essentially atomically clean and ordered surface, and forming the metal contacts.

The first forming step comprises forming the oxide layer such that the oxide layer has overall composition $Ga_xA_yO_z$, as defined above.

In an exemplary embodiment of the article, the oxide contains both Ga and A, and the stabilizer element A is Sc, Y or a rare earth (atomic number 57–71) element. In another exemplary embodiment the oxide layer is an essentially Ga-free oxide of a stabilizer element.

In an exemplary embodiment of the method the oxide layer is formed by simultaneous deposition from two (or possibly more) deposition sources, with one of the sources containing $Ga_2O_3$ (typically in powder form), and the other containing an oxide of a stabilizer element (e.g., $Gd_2O_3$), typically also in powder form. In another exemplary embodiment the oxide layer is formed by deposition from a single deposition source containing an oxide of a stabilizer element, e.g., $Gd_2O_3$.

BRIEF DESCRIPTION OF THE DRAWINGS

FIG. 7 shows an exemplary embodiment of the inventive process in the form of a flow chart;

FIGS. 8–12 schematically show an exemplary portion of an IC according to the invention at various points of the manufacturing process;

Like or analogous features generally are designated by the same numeral in different figures. The figures are not to scale.

DETAILED DESCRIPTION OF THE INVENTION

We have found that, by providing a substantially atomically clean and substantially atomically ordered (typically (100)-oriented) surface of a GaAs-based semiconductor body, and by appropriately limiting exposure of the surface to contaminants prior to completion of the first monolayer of oxide dielectric material on the surface, GaAs-based semiconductor/oxide layer structures having greatly improved interface characteristics can be produced. According to our present understanding, the exposure of the surface to impurities desirably is such that, at $t_m$, impurity coverage of the surface is less than 1% of a monolayer, exemplarily such that the exposure of the surface to impurities is at most 100 Langmuirs (preferably less than 50 or 10 Langmuir. Our measurements to date have not revealed a significant difference in interface quality between structures that had exposures of 100 Langmuirs and 10 Langmuirs, respectively, although the existence of a difference cannot be ruled out. However, we expect that exposure substantially in excess of 100 Langmuirs will result in reduced quality interfaces.

Although in principle any apparatus that can provide the substantially atomically clean surface at $t=t_c$, and the required low exposure during the time from $t_c$ to $t_m$ is potentially suitable for the practice of the invention, in practice the apparatus typically will comprise one or more UHV chambers. In the case of multichamber apparatus, two chambers will generally be linked together by a transfer module which facilitates transfer of the semiconductor body from one chamber to the other without exposure of the body to the ambient atmosphere. Typically the transfer is under UHV conditions. Such apparatus is known. See, for instance, M. Hong et al., *J. Electronic Materials*, Vol. 23, 625 (1994).

Exemplarily, our apparatus comprises a MBE growth chamber (background pressure typically about $2\times10^{-11}$ Torr), a dielectric film deposition chamber (typically about $1\times10^{-10}$ Torr), and a transfer module (typically about $6\times10^{-11}$ Torr) that links the former chambers.

In an exemplary embodiment of the inventive method, a conventional (100)-oriented GaAs substrate was introduced into the MBE growth chamber, and a 1.5 $\mu$m thick GaAs n-type ($2\times10^{16}$ cm$^{-3}$) layer was grown by conventional MBE on the wafer. After completion of GaAs growth and cool-down, the wafer was transferred under UHV to the dielectric growth chamber. Following the transfer the wafer was heated in UHV to 400° C., and the dielectric layer deposited substantially as described below. During deposition the pressure in the chamber unavoidably increased to about $3\times10^{-7}$ Torr. According to our present understanding, the interface properties are substantially fixed as soon as the first monolayer of the dielectric has been deposited.

Figure 1:
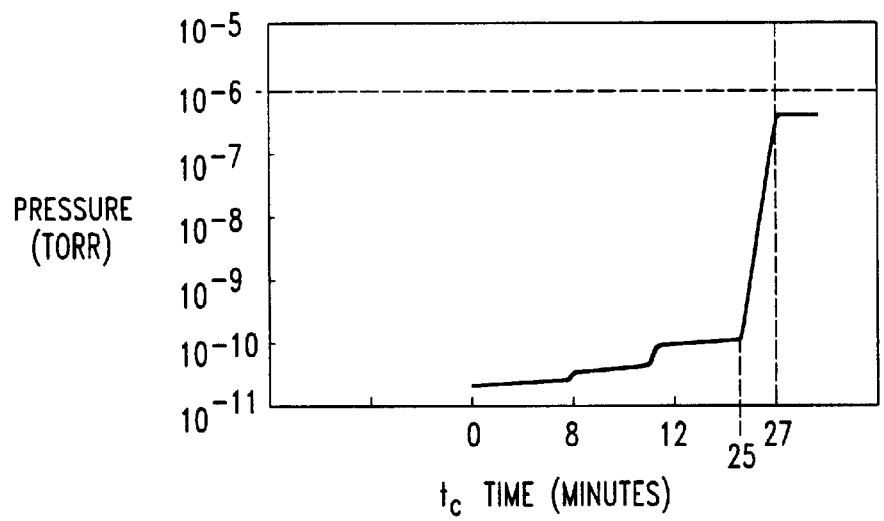
FIG. 1 shows exemplary data on vacuum pressure vs. time during the relevant portion of the process of forming an oxide layer on (100) GaAs.

FIG. 1 shows a schematic curve of pressure vs. time during manufacture in our apparatus of an exemplary GaAs/oxide structure. The oxide growth rate is 0.016 nm/s. As can be readily verified, the total exposure is less than about 10 Langmuir. In FIG. 1, the time of completion of the substantially atomically clean (100)-oriented GaAs surface ($t_c$) is taken to correspond to the origin of the time axis. The period from $t=0$ to $t=t_m$ comprises the time (about 8 minutes) required for the wafer to cool from the GaAs deposition temperature (e.g., 600° C.) to about 200° C., the time (about 4 minutes) required to transfer the wafer in UHV from the GaAs deposition chamber to the oxide deposition chamber, and the time (about 13 minutes) to beat the wafer to the appropriate deposition temperature (e.g., 400° C.). As those skilled in the art will appreciate, the pressure in the chamber unavoidably rises during deposition above the background pressure. However, in our apparatus completion of the first monolayer of the oxide typically takes only a few seconds (the exact value depending on the deposition rate). During MBE deposition of the GaAs layer the $O_2$ pressure was below the detection limit, and the total background pressure was about $2\times10^{-11}$ Torr.

Currently preferred embodiments of the invention comprise As-stabilization of the GaAs surface. Exemplarily, this is done by maintaining the As flux after termination of the Ga flux until the sample has cooled to 500° C.

Figure 2:
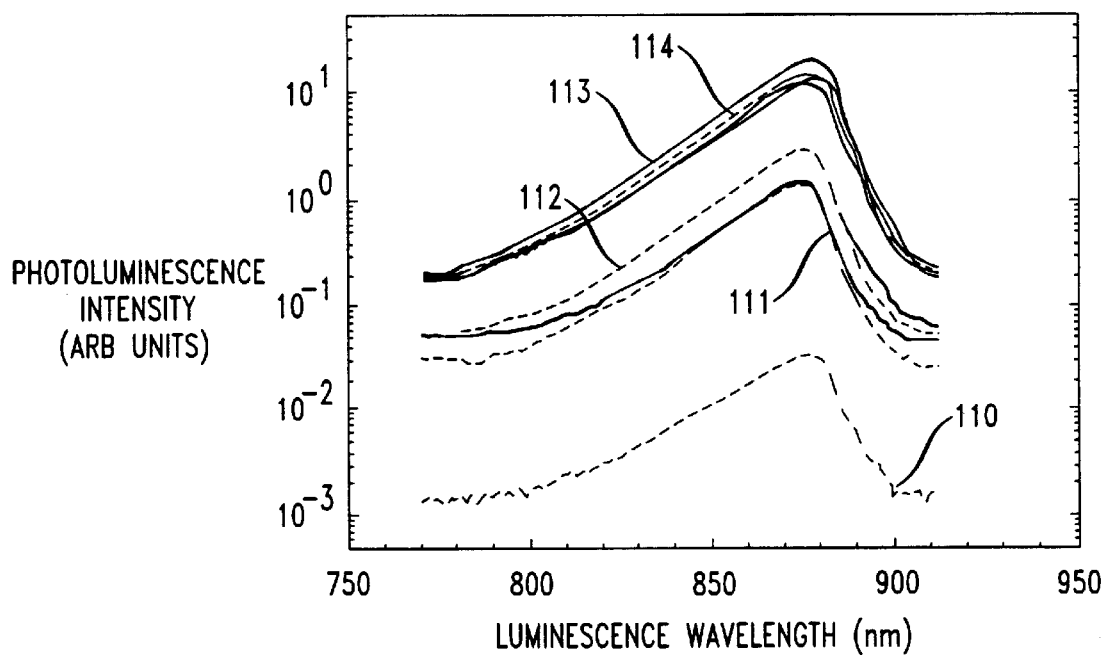
FIGS. 2 and 3 show photoluminescence data that illustrate, respectively, the thermochemical and photochemical stability of GaAs/oxide interfaces.

FIG. 2 shows exemplary photoluminescence data that demonstrates the surprisingly high thermochemical stability of some GaAs/oxide interfaces. Curve 110 was obtained from bare GaAs and is provided for comparison purposes. The remaining curves were obtained from (100) GaAs/oxide structures according to the invention that were annealed for 120 seconds in forming gas. The structures were substantially identical, all having a 26.2 nm SiO$_2$ cap layer for purposes of the annealing experiment. The parameter that distinguishes curves in FIG. 2 is the annealing temperature. Curves 111 pertain to 800 and 900° C., 112 to 750 and 1000° C., 113 to 700° C., 114 to 650° C., with the remaining curves (which are almost identical) pertaining to 400, 500, 550 and 600° C., and to an as-deposited structure.

Figure 3:
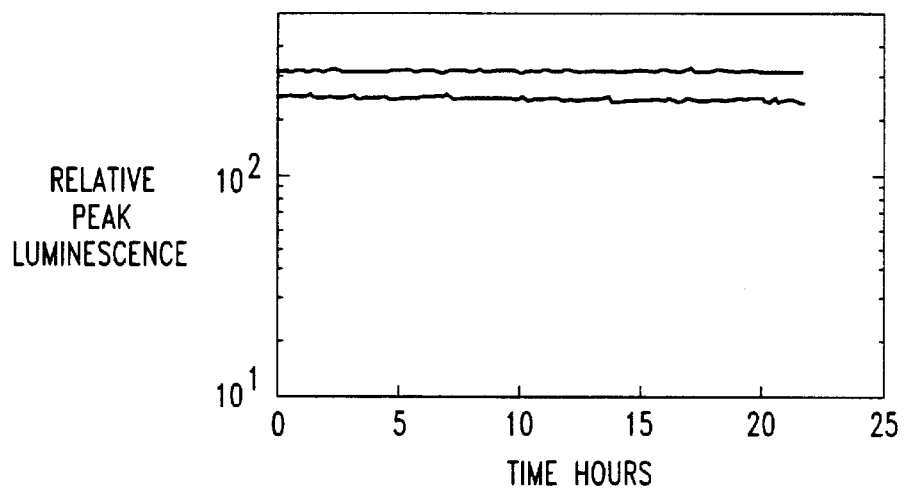

FIG. 3 shows exemplary photoluminescence data that demonstrates the photochemical stability of an exemplary GaAs/oxide interface. Curve 120 pertains to a structure that was annealed at 1000° C. for 30 seconds in forming gas, and curve 121 pertains to an analogous as-deposited structure.

Figure 4:
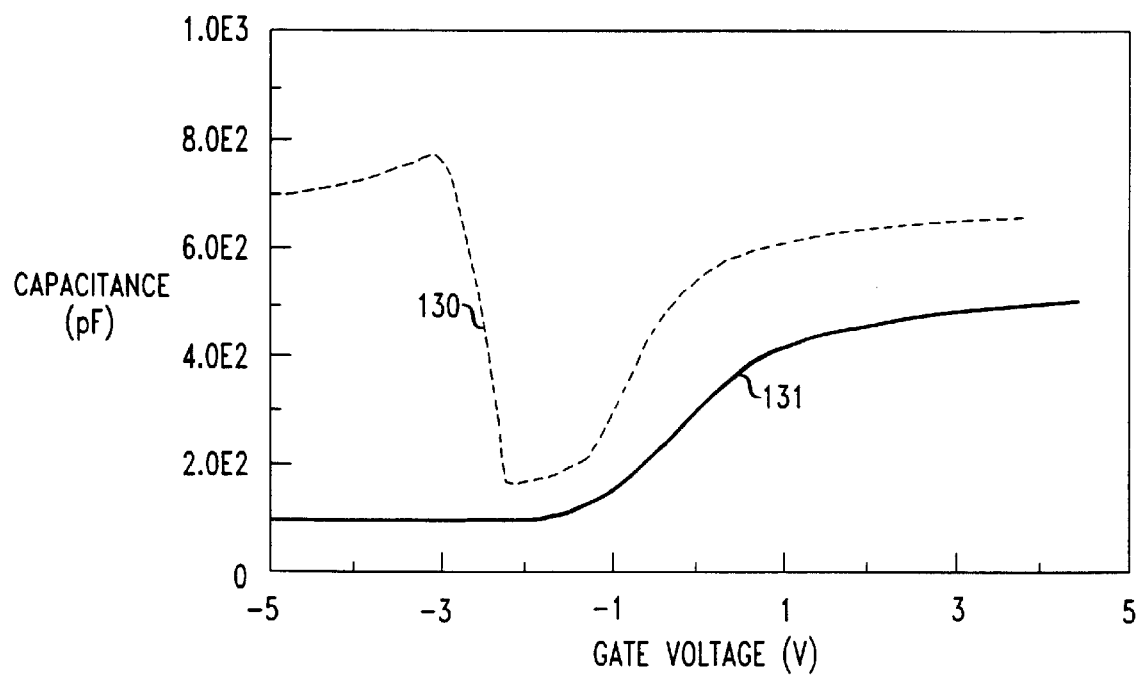
FIG. 4 presents exemplary data on capacitance vs. gate voltage of a MOS structure.

FIG. 4 presents exemplary capacitance vs. gate voltage data for a MOS structure, with curve 130 showing the quasi-static response, and curve 131 showing the high frequency (100 kHz and 1 MHz) response. The oxide thickness was 46 nm, the contact size was $2\times10^{-3}$ cm$^2$, the semiconductor was n-type ($2\times10^{16}$ cm$^{-3}$), and the sweep rate was 100 mV/s. As those skilled in the art will recognize, the data of FIG. 4 demonstrates the existence of inversion as well as of accumulation.

Figure 5:
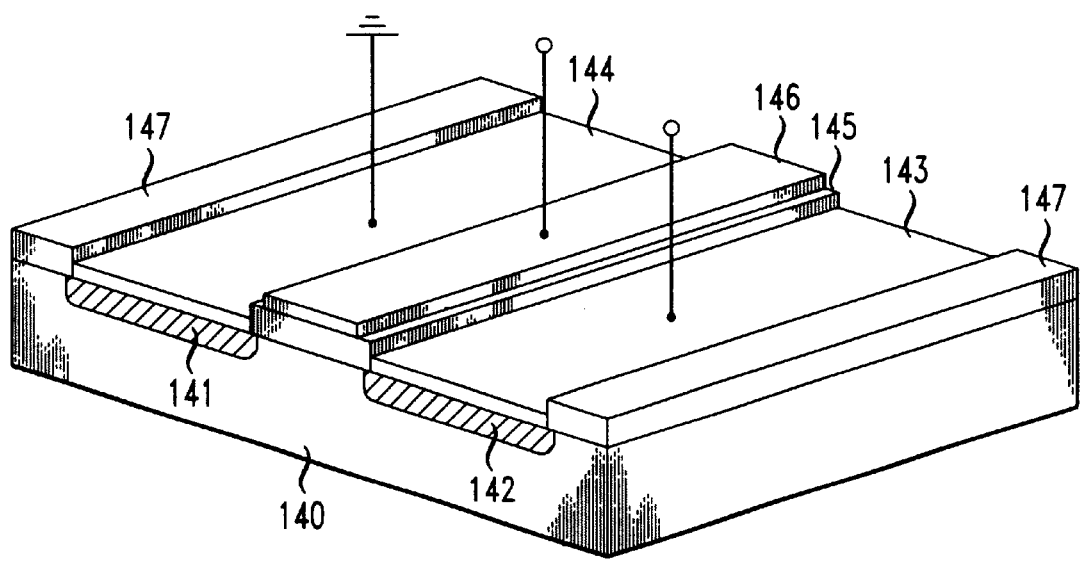
FIGS. 5 and 6 schematically depict exemplary devices according to the invention, namely, a MOS-FET and a HBT, respectively.

FIG. 5 schematically depicts an exemplary electronic device, namely, a GaAs-based MOS-FET. Numerals 140–147 refer, respectively, to the GaAs body (exemplarily p-type), the source region (exemplarily n-type), the drain region (exemplarily n-type), the drain contact, the source contact, the gate oxide, the gate contact and the field oxide. Associated with the interface between 140 and 145 is an interface state density $<10^{11}$/cm$^2$·eV, and typically a recombination velocity $<10^4$ cm/s.

Figure 6:
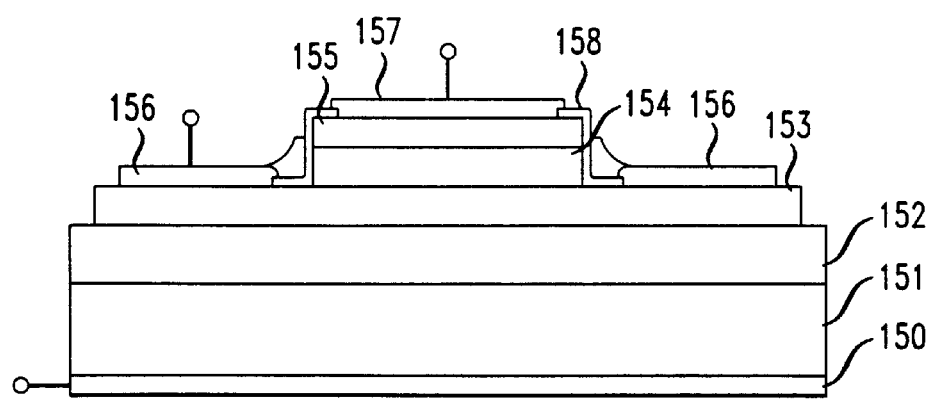

FIG. 6 schematically depicts another exemplary electronic device, namely, a GaAs-based HBT. Numerals 150–158 refer, respectively, to the collector contact, the GaAs substrate (typically n$^+$), the GaAs collector layer (typically n$^-$), the GaAs base layer (typically p$^+$), the emitter layer (exemplarily n-type graded AlGaAs), the emitter contact layer (exemplarily n$^+$AlGaAs), the base contact, the emitter contact and the oxide passivation layer. Associated with the interface between the semiconductor material and oxide layer 158 are the above specified values.

Those skilled in the art will appreciate that in general devices according to the invention are structurally similar or identical to the corresponding (existing or proposed) prior art structures. However, due to the presence of the high quality GaAs/oxide interface that can be produced by the inventive method, these devices will have substantially improved characteristics. For instance, in a HBT according to the invention the presence of the improved oxide passivation layer will result in significantly reduced recombination in the extrinsic base region, with attendant improvement in device characteristics.

FIG. 7 shows in flow chart form a MOS-FET manufacturing process according to the instant invention, and FIGS. 8–12 schematically depict various steps of device processing.

Steps A and B of FIG. 7 respectively require provision of a GaAs substrate and formation of a patterned implant mask. The substrate typically is a conventional semi-insulating GaAs wafer, but could be such a wafer with one or more epitaxial layers thereon. For the sake of concreteness, the discussion below will be in terms of a conventional (100) semi-insulating GaAs substrate.

Formation of a patterned implant mask exemplarily involves deposition of a thin layer of dielectric material (e.g., $SiO_2$, $SiN_x$, $SiO_xN_y$, exemplarily 40–200 nm thick) on the major surface of the substrate, deposition of a conventional photoresist layer on the dielectric layer, and patterning of the photoresist layer such that appropriate windows are formed through the photoresist of the dielectric. This is followed by ion implantation (see step C) into the GaAs material that underlies the windows. Steps B and C will typically be repeated one or more times, to attain the dopant distribution shown in FIG. 8. Provision of the dielectric layer is optional but preferred.

FIG. 8 shows semi-insulating GaAs substrate 181 and dielectric layer 182. Implanted regions are shown, the implants selected to facilitate formation of a p-MOS-FET 180 and a n-MOS-FET 188. Only the steps leading to formation of the p-MOS-FET will be discussed in detail, since those leading to the n-MOS-FET are either identical or are obvious variations, e.g., substitution of a p-implant for an n-implant.

Exemplarily, n-type region 183 is formed by implantation of Si or S through dielectric layer 182 in photoresist-defined areas of the wafer. After removal of the photoresist mask, a new mask for implantation of additional Si or S into channel contact 184 is provided, and the $n^+$ channel contact is formed. This is followed by formation (by Be or Zn implantation) of $p^+$ source 185 and $p^+$ drain 186. This in turn is optionally followed by formation (by ion implantation) of p source and drain regions 187 and 189, respectively.

Step D of FIG. 7 involves annealing of the ion implanted substrate under conditions effective for activating the implanted ions, with or without dielectric layer 182 on the substrate. With retained dielectric layer the implant activation anneal exemplarily is accomplished in rapid thermal anneal (RTA) apparatus, typically at a temperature in the range 780–860° C. for a time in the range 2–5 minutes. Alternatively and preferably, the dielectric layer is removed (e.g., with HF), and the wafer is heated in an evacuable reactor to a temperature in the above range, with the wafer in contact with an As-containing atmosphere. Exemplarily, when the wafer reached 300° C., the wafer was maintained at that temperature for 5 minutes under flowing $H_2$, followed by heating to 825° C. under $H_2$ and $AsH_3$ ($H_2$:$AsH_3$ flow 70:1). The wafer was maintained at 825° C. for 5 minutes, followed by cooling to room temperature. As an alternative to the use of $H_2$+arsine, elemental arsenic vapor could be used. Desirably the atmosphere contains enough As or As-containing species (e.g., arsine) to prevent net loss of As from the substrate surface. The required partial pressure of As or As-containing species depends inter alia on the annealing temperature, and thus cannot be specified in generality. However, a minor amount of experimentation will typically suffice to determine appropriate conditions. Exemplarily, we have achieved substantially 100% activation of implanted Be, with essentially no net loss of As from the wafer surface, when annealing the wafer at 825° C. for 5 minutes under 45 Torr of arsine and $H_2$ (about 1:70 flow rate ratio).

Step E of FIG. 7 typically involves formation of a dielectric layer (exemplarily about 200 nm of $SiO_2$) on the wafer surface, followed by formation of an appropriately patterned photoresist layer that has windows for channel contact, source contact and drain contact. In the window regions, the dielectric material is removed by conventional etch, e.g., with HF. In FIG. 9, numeral 191 refers to the dielectric layer, and 192 to the photoresist.

Figure 10:
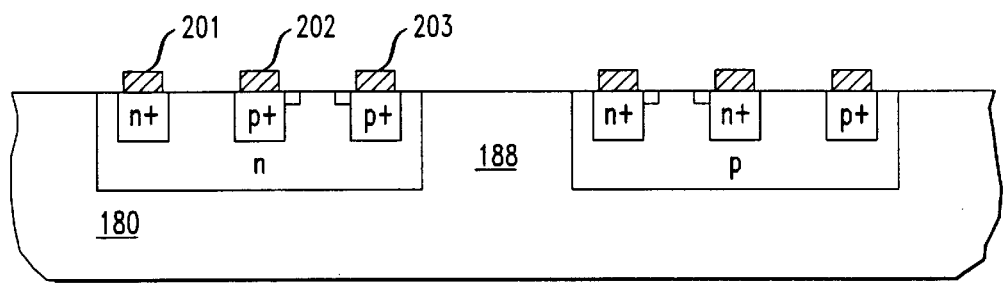

Step E of FIG. 7 further comprises deposition of ohmic contacts. For instance, p-contact metal (exemplarily 25 nm AuBe/200 nm Au) is deposited by e-beam deposition and sputtering. After lift-off of the photoresist, a new photoresist layer is deposited and patterned for n-contact metallization, using, for instance, 5 nm Ni/5 nm Ge/10 nm AuGe/20 nm Mo/200 nm Au. FIG. 10 shows the result of the metallization, wherein numeral 201 refers to the n-contact metal of the channel contact, and numerals 202 and 203 refer to the p-contact metal of the source and drain contact, respectively.

Ohmic contact deposition prior to gate oxide formation is not a requirement, and the deposition could be performed subsequent to gate oxide formation.

Step F of FIG. 7 involves removal of native oxides (and possibly other contaminants) from the wafer surface. The removal has to be carried out such that an essentially atomically clean, essentially atomically ordered, surface results. Creation of such a "reconstructed" surface is an important aspect of the process according to the invention. It can be accomplished in any appropriate manner, and will typically be carried out under high vacuum (e.g., pressure $\leq 10^{-8}$ Torr). Among currently preferred techniques for producing a reconstructed GaAs surface are thermal desorption (e.g., 5 minutes at 580° C., As overpressure at $10^{-6}$ Torr to protect the wafer surface), and low damage dry etching techniques such as ECR with $H_2$ plasma or atomic hydrogen.

After completion of surface reconstruction, the gate oxide layer is formed (step G of FIG. 7) in situ on the reconstructed surface, i.e., without removal of the wafer from the high vacuum. Not only is the oxide layer grown in situ, but the time between completion of surface reconstruction and commencement of oxide deposition is desirably kept to a minimum, in order to avoid significant (e.g., in excess of 100 Langmuirs) contamination of the surface.

Exemplarily the wafer is maintained at a temperature of at most 580° C. under arsenic overpressure (e.g., $10^{-6}$ Torr As) during gate oxide deposition. The oxide typically is deposited substantially uniformly over the whole wafer surface, but deposition could, at least in principle, be limited to particular portions of the surface, these portions including the gate region between source and drain of at least one MOS-FET. Further details of gate oxide formation are discussed below.

Figure 11:
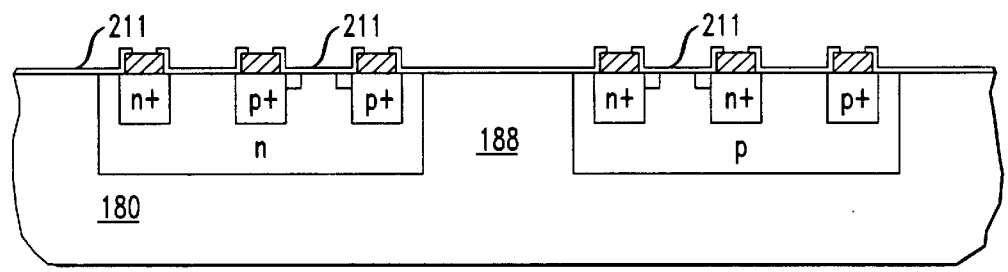

Subsequent to gate oxide deposition, the oxide is patterned to expose the previously formed channel, source and drain contacts of the MOS-FETs, as indicated by step H of FIG. 7. The patterning can be done using conventional photolithography and etching, e.g., in HCl solution. FIG. 11 schematically shows two devices after gate oxide patterning, with numeral 211 referring to the patterned gate oxide.

Figure 12:
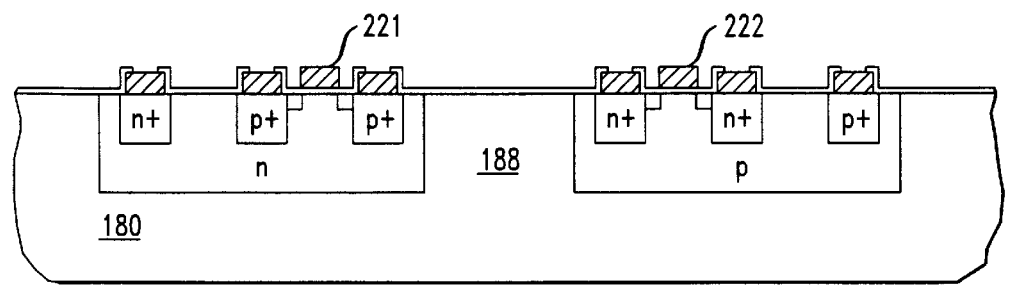

Patterning of the gate oxide layer is followed by gate metallization, also per step H of FIG. 7. This can be conventional, involving for instance e-beam deposition of 25 mm Ti/50 nm Pt/300 nm Au, and lift-off. Typically this step can also include formation of interconnections, including providing connections (not shown in FIG. 12) to channel, source, drain and gate contacts of the various MOS-FETs. In FIG. 12, numerals 221 and 222 refer to the gate contact of the p-MOS-FET and n-MOS-FET, respectively.

Step I of FIG. 7 refers to a variety of, typically conventional, steps that will typically be required to complete an IC according to the invention, e.g., testing, dicing of the wafer into chips, wire bonding, encapsulation, etc.

Figure 13:
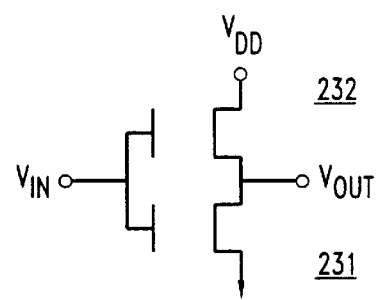
FIG. 13 shows the diagram of an exemplary circuit comprising complementary MOS-FETs.

The thus produced MOS-FET desirably will be electrically connected in conventional manner to other electronic devices, including other MOS-FETs, to form an integrated circuit. By way of example, the complementary MOS-FETs of FIG. 12 can be connected as shown in FIG. 13 to provide an inverter. In FIG. 13, numeral 231 refers to a n-channel enhancement mode GaAs MOS-FET substantially as shown in FIG. 12 and 232 refers to a p-channel enhancement mode GaAs MOS-FET, also substantially as shown in FIG. 12. The circuit per se is conventional, but the implementation in GaAs MOS-FET technology is novel, to the best of our knowledge. The combination of FIG. 13 is representative of circuits according to the invention.

As those skilled in the art will recognize, the above described process not only is suitable for producing GaAs-based planar n-channel and p-channel MOS-FETs on the same substrate, but can also be used to combine such MOS-FETs with GaAs (metal-semiconductor) MES-FETs. In order to produce a MES-FET, the gate oxide exemplarily is removed from the respective gate region, and an appropriate metal (e.g., Ti/Pt/Au) is deposited in the gate region to provide a Schottky barrier contact. GaAs-based MES-FETs are known and do not require detailed description. However, the ability to integrate GaAs MES-FETs with GaAs MOS-FETs (including complementary enhancement type GaAs-MOSFETs) does, to the best of our knowledge, not exist in the prior art. Availability of this ability is expected to provide circuit designers with greater design freedom, and to lead to manufacture of a wide range of GaAs-based digital (but not excluding analog) ICs.

Some differences between prior art GaAs MOS-FETs and GaAs MOS-FETs according to the invention may bear further recitation. For instance, in some prior art devices the source and drain regions are connected by a channel of the same conductivity type as the regions. See, for instance, the above cited paper by Colquhoun et al. Such devices do not exhibit inversion in the channel.

Some prior art devices require selective etching of the surface of the GaAs wafer, typically to form a notch in the surface to thereby reduce the channel width. See, for instance, the above cited paper by T. Mimura et al., FIGS. 7 and 8, and the Colquhoun et al. paper. No such etching is required for GaAs MOS-FETs according to the invention.

The above described embodiment of the invention is exemplary only, and variations can readily be devised, if desired. For instance, ohmic contacts can be formed after gate oxide deposition. Furthermore, oxide layers as described above can also be used for passivation purposes, exemplarily for opto-electronic devices.

There are non-optional features of the inventive process which are currently deemed necessary for the production of GaAs-based MOS-FETs of acceptable characteristics. Among them are reconstruction of the relevant areas of the implanted wafer such that the surface areas are essentially atomically clean and ordered, and in situ growth of the gate oxide on the reconstructed surface regions. In preferred embodiments the method is carried out such that the device is, after gate oxide formation, not subjected to a temperature above about 300° C. in air, or $\geq 700°$ C. in UHV. A highly preferred feature is implant activation anneal in an As-containing atmosphere, with the partial pressure of As or As-containing species selected to prevent net loss of As from the surface.

MOS-FETs produced according to the invention have been tested in conventional fashion, and have been found to have excellent characteristics.

It is apparent from a variety of references (e.g., U.S. Pat. Nos. 5,550,089 and 5,597,768; M. Passlack et al., *Applied Physics Letters*, Vol. 69(3), pp. 302–304) that it is widely assumed in the art that e-beam evaporation from single crystal GGG (gadolinium gallium garnet; $Gd_3Ga_5O_{12}$) can result in the deposition of a thin film that is almost pure $Ga_2O_3$, with only a small amount (e.g., 0.1 at %) Gd also present in the film.

Furthermore, it is believed that the presence of the Gd is undesirable, and that ideally the film should be pure Ga oxide. See, for instance, U.S. Pat. No. 5,597,768, which discloses at col. 1, lines 39–45 that ". . . The major problem is that some of the $Gd_2O_3$ (about 0.1% according to the patent) is incorporated into the thin film as impurities creating defects increasing the bulk trap density. The increased defects and, in turn, increased bulk trap density degrades the performance of the devices in which the thin film is used." In order to decrease the "impurity" level in the $Ga_2O_3$ thin film, the '768 patent teaches use of different evaporation source materials that "contain" $Ga_2O_3$ and another oxide having a melting temperature that is more than 700° C. above the sublimation temperature of $Ga_2O_3$. One such material is $MgGa_2O_4$, which is said to "contain" MgO and $Ga_2O_3$. The use of $MgGa_2O_4$ instead of GGG is said to result in ". . . drastically reduced incorporation of the undesired specie in the oxide film and in significantly lower bulk trap density in the oxide film." See col. 3, lines 18–21 of the '768 patent. However, the '768 patent does not provide any experimental data.

Our continued research (which included Rutherford Backscattering Spectrometry (RBS) and Auger analysis of very thin deposited films) now has yielded results that lead to a different approach to making a device-grade (e.g., interface state density $1 \times 10^{11}$ cm$^{-2}$eV$^{-1}$ or below; with low leakage current and high breakdown voltage) thin oxide film on GaAs and GaAs-based semiconductor bodies.

Figure 17:
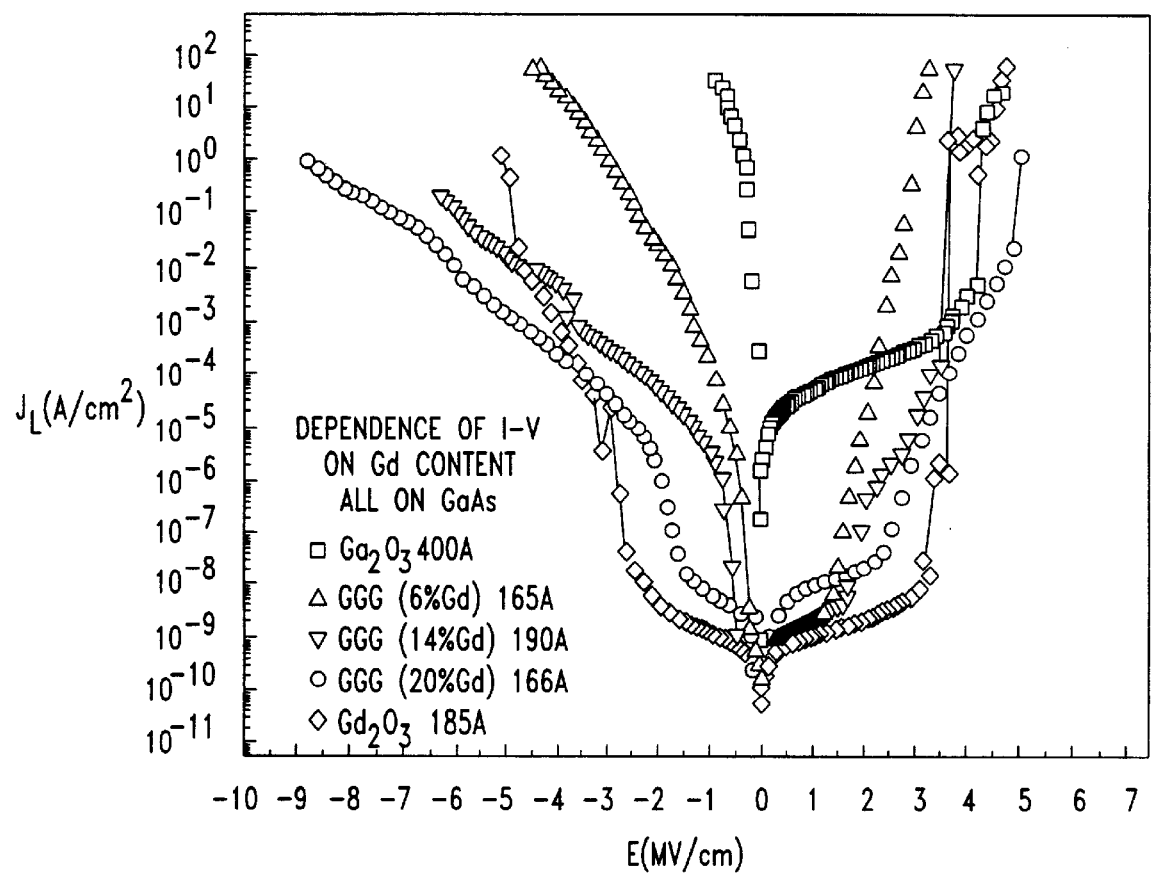
FIGS. 17–19 show measurement data from GaAs/oxide/metal structures of various compositions.

We have found inter alia that, contrary to the teaching of the '768 patent, the oxide thin film desirably contains a substantial amount of Gd (or other appropriate metal element). Indeed, we have found that a film that is formed by evaporation from pure $Ga_2O_3$ powder (and thus is essentially pure Ga oxide) is generally not of device quality, whereas a film that is formed by evaporation from pure $Gd_2O_3$ (and thus is essentially pure Gd oxide) is generally of device quality, with low interface state density. This is exemplified by FIG. 17, which shows data on the I–V (current-voltage) characteristics of very thin oxide layers on GaAs, with a conventional metal contact defining the area of the MOS capacitor. As can be readily seen from FIG. 17, a 40 nm thick $Ga_2O_3$ film has essentially zero breakdown voltage for negative bias, with relatively high leakage for positive bias, and thus is unsuitable for most device applications, whereas a 18.5 nm thick $Gd_2O_3$ film conducts a mere $10^{-8}$ A/cm$^2$ at + or −3V. Films of intermediate composition (Gd content 6, 14 and 20 atomic % of the total metal content of the film) show intermediate breakdown voltages.

We have found that a thin oxide film that is formed by in situ co-evaporation from two separate sources, e.g., one using $Ga_2O_3$ powder and the other $Gd_2O_3$ powder, generally will be of device quality, provided the evaporation rates are selected such that the content of Gd (or other appropriate metal element) is at least about 10 atomic % of the total metal content, preferably at least 20 atomic %.

It will be understood that the GaAs substrates were prepared as described above (resulting in an essentially atomically clean and atomically ordered surface), with the evaporations carried out in situ, without exposure of the samples to the atmosphere.

The above-described experimental facts are consistent with the requirement that in mixed oxide films (of overall composition $Ga_xA_yO_z$, with A, x, y and z as defined above) the Ga ions are caused to be in their 3+ oxidation state. This is facilitated through appropriate choice of stabilizer element and oxygen content.

It is known that Ga can exist in the 1+, 2+ and 3+ oxidation states, and that there are electro-positive elements (to be termed "stabilizers") that can stabilize Ga in the 3+ state. Among the stabilizers for Ga is Gd, having Pauling electronegativity 1.1. Among other possible stabilizers for Ga are Sc, Y, the other rare earths, the alkaline earths and the alkalis. In addition to provision of a stabilizer element for Ga, it is also required that sufficient oxygen be present in the deposited film to satisfy the requirement that Ga and the stabilizer element are substantially fully oxidized.

The above exposition is for tutorial purposes only, and is not intended to limit the scope of the invention.

In exemplary embodiments of the invention the oxide film is formed by deposition from 2 (or more) separate deposition sources (e.g., e-beam evaporation sources), with the deposition parameters selected such that the resulting film has overall composition $Ga_xA_yO_z$, where A is one or more electropositive stabilizer element for stabilizing Ga in the 3+ oxidation state, and x>0. Furthermore, y/(x+y) is greater than or equal to 0.1, preferably $\geq 0.2$, and z is selected to satisfy the requirement that both Ga and A are substantially fully oxidized.

In other exemplary embodiments, the oxide film is formed by deposition of A-oxide, without deposition of Ga-oxide. The film thus has overall composition $AO_z$, with z selected such that A is substantially fully oxidized.

By way of example (for both x=0 and x>0), A is selected from the group consisting of Sc, Y, the rare earth metals (atomic number 57-71), the alkaline earths (e.g., Be, Mg, Ca, Sr, Ba), and the alkalis (e.g., Li, Na, K, Rb, Cs).

The alkali elements generally are not preferred, due to their relative instability to moisture and incompatibility with semiconductor device processing conditions. The currently preferred stabilizer elements are Sc, Y, the rare earths (atomic number 57-71) and the alkaline earths, with Sc, Y, La, Nd, Gd, Dy, Ho, Er and Lu being currently most preferred.

It will be understood that the requirement that, in mixed oxide films, Ga (and A) are substantially fully oxidized does not mean that 100% of all Ga ions have to be in the 3+ ionization state. Typically acceptable results are obtained if 80% or more of all Ga is in the 3+ state, with 80% or more of A also being fully oxidized.

It will also be understood that a mixed oxide of composition $Ga_xA_yO_z$ is not necessarily a homogeneous material of that composition. Presently it can not be ruled out that the material contains microscopic regions of Ga-oxide as well as microscopic regions of A-oxide.

Figure 18:
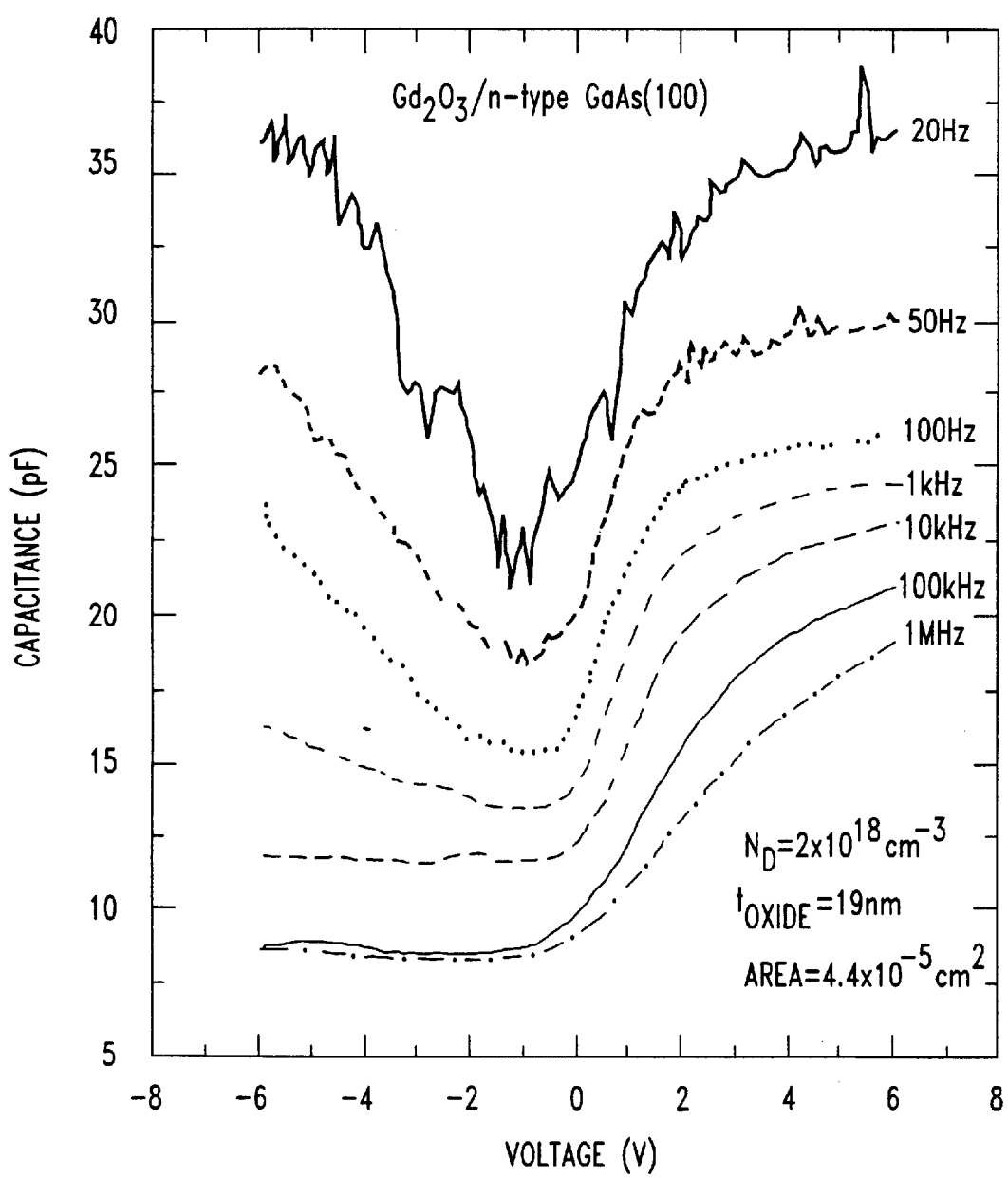

FIG. 18 shows C-V (capacitance-voltage) data for a 19 nm thick film of $Gd_2O_3$ on n-type ($4 \cdot 10^{17}$ $cm^{-3}$) GaAs of (100) orientation. The area of the MOS capacitor was $4.4 \times 10^{-5}$ $cm^2$. FIG. 18 clearly shows accumulation and inversion at low frequency. The data establishes the suitability of the oxide film for device applications, including for MOS-FETs.

Figure 19:
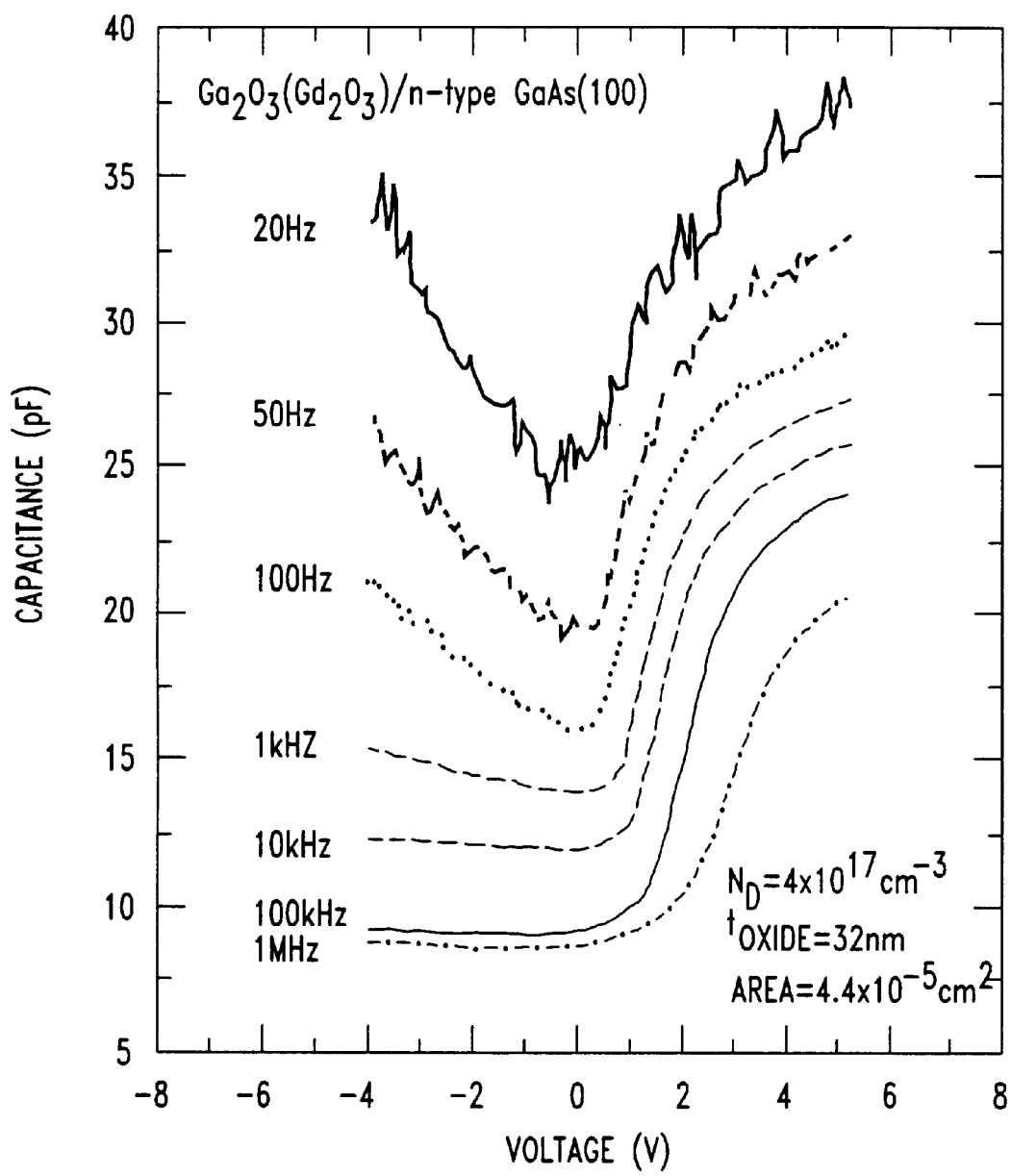

FIG. 19 shows similar data for a 32 nm thick Ga- and Gd-containing mixed oxide film, with about 22 atomic % of the total metal content being Gd. The data also shows accumulation and inversion, substantially as the data of FIG. 18.

In an exemplary preferred embodiment the article comprises a planar enhancement mode MOS-FET with inversion channel.

EXAMPLE 1

A p-MOS-FET was fabricated as follows. A conventional semi-insulating (100) oriented GaAs wafer (sheet resistivity about $10^8 \Omega \cdot cm$) was provided. On the surface of the wafer was deposited, by conventional PECVD, a 50 nm layer of $SiO_2$. A 2.2 μm layer of conventional photoresist (AZ 1818) was formed on the $SiO_2$ layer and patterned to form an ion implantation mask, with a window through the mask that defined the n channel for the p-MOS-FET. Si ions were then implanted through the window (150 keV, $5 \times 10^{13}$ $cm^{-2}$). This first implantation was followed by further implantations to form the $n^+$ channel contact region, $p^+$ source and drain regions, and p low dose drain. Implant conditions were, respectively, as follows: 75 KeV, $6 \times 10^{13}$ $cm^{-2}$, Si; 30 KeV, $7 \times 10^{13}$ $cm^{-2}$, Be; and 25 KeV, $3 \times 10^{12}$ $cm^{-2}$, Be.

After implantation, the resist and $SiO_2$ were removed with acetone and HF (1:1 $HF:H_2O$), respectively. Implant activation was carried out in the reactor of a MOCVD system. The temperature of the wafer was raised, with $H_2$ admitted into the reactor when the wafer temperature had reached 300° C. The wafer was maintained under these conditions for 5 minutes, followed by admission of arsine and raising of the temperature to 825° C., and maintenance of the wafer under these conditions for 5 minutes. The arsine: $H_2$ flow ratio and system pressure were 1:70 and 45 Torr, respectively.

After 5 minutes at 825° C. the wafer was allowed to cool to 450° C. under $arsine/H_2$, and then to room temperature under $H_2$, and transferred to a MBE system for surface reconstruction and gate oxide deposition. The wafer was mounted on a Mo block with indium and heated to 580° C. for 5 minutes to desorb surface contaminants such as native oxides. The background pressure in the reactor of the MBE system was $10^{-10}$ Torr, and an arsenic pressure of $10^{-6}$ Torr was maintained in the reactor to protect the wafer surface. RHEED was used to monitor the sample surface. The above described treatment resulted in an essentially atomically clean, atomically ordered wafer surface.

Upon completion of surface reconstruction, the wafer was transferred under UHV ($10^{-10}$ Torr) to a second chamber of the MBE system. A 40 nm layer of Ga-Gd-oxide is deposited over the wafer surface at a rate of about 0.02 nm/sec. Briefly, the wafer is at 550° C., the background pressure in the chamber is less than $10^{-9}$ Torr, and the Ga-Gd-oxide is formed by simultaneous e-beam evaporation from $Gd_2O_3$ powder and $Ga_2O_3$ powder, with deposition conditions adjusted such that the resulting Ga-Gd-oxide layer has overall composition $Ga_xGd_yO_z$, with x being about 0.8 and y being about 0.2. The oxygen content is selected such that both Ga and Gd are fully oxidized, exemplarily z is about 3.

After completion of gate oxide deposition and cooling of the wafer to room temperature, the ohmic contacts are defined. A conventional photoresist layer (AZ 1818) is applied and patterned in conventional manner such that the gate source and drain contact regions are exposed. The gate oxide is then removed from the exposed regions with 1:1 $HCl:H_2O$, and contact metal (25 nm AuBe/200 nm Au) is deposited by means of an e-beam deposition system. A conventional acetone lift-off technique is used to remove the undesired metallization. Finally, a 1.2 μm resist layer (AZ 1811) is applied and patterned, and used to define gate and final metal contacts at the same time. A Pt/Ti/Pt/Au layer (5 nm/25 nm/50 nm/300 nm, respectively) is deposited by means of an e-beam deposition system. Unwanted metallization is removed with a conventional acetone lift-off technique, leaving channel, source, drain and gate contacts.

Figure 14:
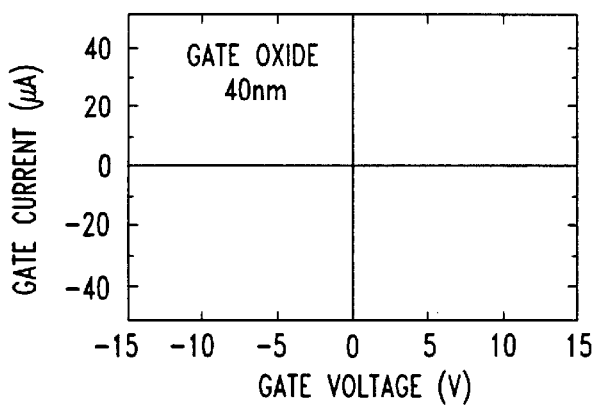
FIGS. 14–16 show electrical characteristics of an exemplary enhancement-mode p-channel GaAs MOS-FET.
Figure 15:
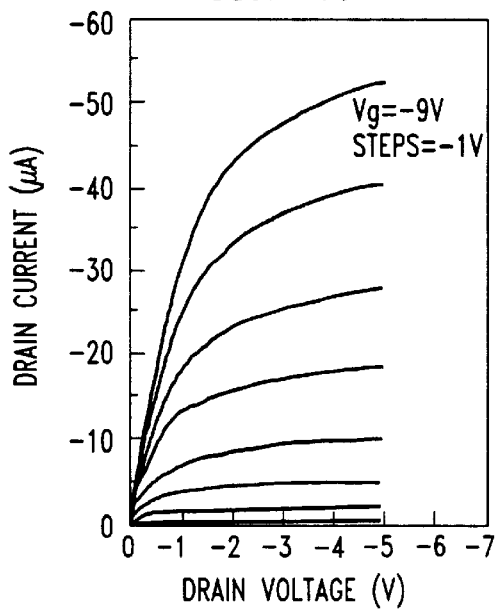
Figure 16:
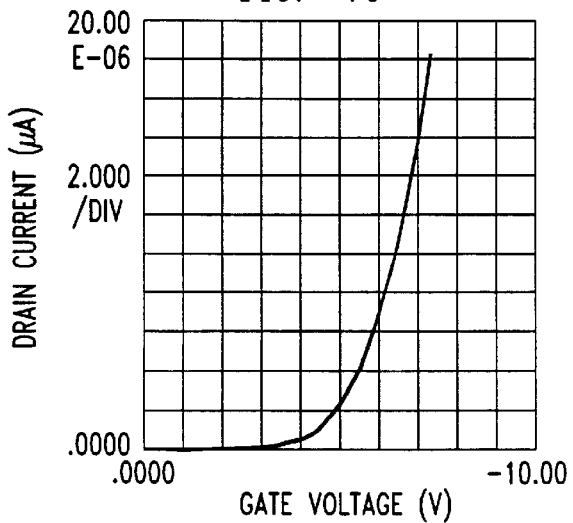

The thus produced device (40×50 μm² gate geometry) is tested, and is found to have characteristics substantially as shown in FIGS. 14–16.

As demonstrated by FIG. 14, the gate oxide has breakdown voltage of about 3.6×10⁶ Volt/cm. The transconductance is about 0.3 mS/mm. FIG. 15 shows the drain I–V characteristics and FIG. 16 shows drain current vs. gate voltage.

EXAMPLE 2

A pair of complementary MOS-FETs on a common substrate are produced substantially as described above, except that the ion implantation is modified to produce implanted regions substantially as shown in FIG. 8. The pair of MOS-FETs is connected as shown in FIG. 13 to form an inverter circuit. The circuit is tested and performs as expected.

EXAMPLE 3

A multiplicity of n-MOS-FETs, p-MOS-FETs and n- and p-MES-FETs are formed on a common substrate, substantially as described in Example 2, except that the gate oxide is removed from some of the n-type devices and some of the p-type devices, and 5 nm Pt/25 nm Ti/30 nm Pt/300 nm Au is deposited in the gate regions of these devices. After provision of conductive interconnects between the devices, the resulting circuit is tested and performs as expected.

EXAMPLE 4

A MOS-FET is fabricated substantially as in Example 1, except that the oxide deposition conditions are selected such that the gate oxide film is $Gd_2O_3$. The MOS-FET performs substantially as the device of Example 1.

The invention claimed is:

1. A method of making a GaAs-based integrated circuit comprising at least one planar metal-oxide-semiconductor field effect transistor ("MOS-FET"), the method comprising
   a) providing a GaAs substrate having a major surface and a first conductivity type region;
   b) implanting second conductivity type dopant ions into predetermined portions of the first conductivity type region, said predetermined portions including a source region and a drain region of the at least one MOS-FET;
   c) heating the substrate to a temperature effective for activating of at least a major portion of said implanted dopant ions, with the substrate being exposed to an As-containing atmosphere during at least a part of said heating, the As-content selected such that As-loss from the substrate is essentially avoided; and
   d) treating the substrate such that at least a portion of the major surface between said source region and drain region is essentially atomically clean and essentially atomically ordered, said portion of the major surface to be referred to as the gate region of the at least one MOS-FET;
   e) forming a layer of oxide at least on said gate region substantaily without exposure of said gate region to contamination;
   f) forming a metal contact on said layer of oxide, and forming, either before or after forming said layer of oxide, metal contacts on said source region and drain region, respectively, wherein
   g) step e) is carried out such that the oxide has overall composition $Ga_xA_yO_z$, where Ga is substantially in a 3+ oxidation state, A is one or more electropositive stabilizer element adapted for stabilizing Ga in the 3+ oxidation state, x is greater than or equal to zero, z is selected to satisfy the requirement that both Ga and A are substantially fully oxidized, and $y/(x+y)$ is greater than 0.1.

2. Method according to claim 1, wherein x=0 and more than 80% of A is fully oxidized, or x>0 and more than 80% of each of Ga and A is fully oxidized.

3. Method according to claim 1, wherein A is selected from the group consisting of Sc, Y, the rare earth elements and the alkaline earth elements.

4. Method according to claim 3, wherein A is selected from the group consisting of Sc, Y, La, Nd, Gd, Dy, Ho, Er and Lu.

5. Method according to claim 4, wherein A is Gd.

6. Method according to claim 1, wherein x=0 and at least 90% of A is fully oxidized.

7. Method according to claim 1, wherein x>0, $y/(x+y)$ is at least 0.2, and at least 90% of each Ga and A is fully oxidized.

8. Method according to claim 1, wherein the GaAs-based semiconductor body is a GaAs body.

9. Method according to claim 1, wherein the article comprises a planar enhancement mode MOS-FET with inversion channel.

10. Method according to claim 1, wherein step e) is carried out without exposure of the gate region to more than 100 Langmuirs of contaminant.

11. Method according to claim 1, wherein step a) comprises providing a semi-insulating GaAs wafer, and forming said first conductivity type region by implanting first conductivity type dopant ions into said wafer.

12. Method according to claim 11, further comprising forming a second conductivity type region in the GaAs wafer by implanting second conductivity type dopant ions into the GaAs wafer, and implanting first conductivity type dopant ions into predetermined portions of the second conductivity type region, said predetermined portions including a source region and a drain region of a further FET, said second conductivity type region being spaced apart from said first conductivity type region.

13. Method according to claim 12, wherein steps c)-f) of claim 1 include forming the layer of oxide such that said oxide is formed also between said source region and drain region of the further FET, and further include providing metal contacts to said further FET, said metal contacts including a gate contact.

14. Method according to claim 13, wherein said gate contact is formed on the oxide between the source region and drain region of the further FET, said further FET being a MOS-FET that is complementary to said at least one MOS-FET.

15. Method according to claim 1, the method carried out such that the oxide is also formed on a gate region of a further FET, the method further comprising removing said oxide from said gate region of the further FET, and depositing a metal contact on the GaAs in the gate region of the further FET, the further FET being a metal-semiconductor FET.

16. Method according to claim 14, comprising providing an electrical connection between said at least one MOS-FET and the complementary MOS-FET, the two connected MOS-FETs being at least a part of said GaAs-based integrated circuit.

17. Method according to claim 15, comprising providing an electrical connection between said at least one MOS-FET and the metal-semiconductor FET, the connected MOS-FET and metal-semiconductor FET being at least a part of said GaAs-based integrated circuit.

* * * * *